(12) United States Patent
Schneemeyer et al.

(10) Patent No.: US 6,437,392 B1
(45) Date of Patent: Aug. 20, 2002

(54) ARTICLE COMPRISING A DIELECTRIC MATERIAL OF ZR-GE-TI-O OR HF-GE-TI-O AND METHOD OF MAKING THE SAME

(75) Inventors: Lynn Frances Schneemeyer, Westfield; Robert Bruce Van Dover, Maplewood, both of NJ (US)

(73) Assignee: Agere Systems Optoelectronics Guardian Corp., Orlando, FL (US)

( * ) Notice: Subject to any disclaimer, the term of this patent is extended or adjusted under 35 U.S.C. 154(b) by 0 days.

(21) Appl. No.: 09/456,807

(22) Filed: Dec. 8, 1999

(51) Int. Cl.[7] .............................................. H01L 27/108
(52) U.S. Cl. ........................ 257/310; 257/410; 257/532
(58) Field of Search ................................ 257/310, 410, 257/532, 607

(56) References Cited

U.S. PATENT DOCUMENTS 5,112,700 A * 5/1992 Lambert et al. ............. 428/690
5,821,005 A * 10/1998 Kijima et al. ............... 428/701

* cited by examiner

*Primary Examiner*—Mark V. Prenty
(74) *Attorney, Agent, or Firm*—Lowenstein Sandler PC

(57) ABSTRACT

The invention relates to dielectric materials comprising films of R—Ge—Ti—O where R is selected from Zr and Hf, and to methods of making the same. The dielectric material preferably has the formula $R_x$—$Ge_y$—$Ti_z$—$O_w$ where $0.05 \geq x \leq 1$, $0.05 \geq y \leq 1$, $0.1 \geq z \leq 1$, and $1 \geq w \leq 2$, and $x+y+z \cong 1$, and more preferably, where $0.15 \geq x \leq 0.7$, $0.05 \geq y \leq 0.3$, $0.25 \geq z \leq 0.7$, and $1.95 \geq w \leq 2.05$, and $x+y+z \cong 1$. The invention is particularly useful in silicon-chip integrated circuit devices including a capacitor of a dynamic random access memory (DRAM) device.

15 Claims, 7 Drawing Sheets

ARTICLE COMPRISING A DIELECTRIC MATERIAL OF ZR-GE-TI-O OR HF-GE-TI-O AND METHOD OF MAKING THE SAME

FIELD OF THE INVENTION

The invention relates to dielectric materials comprising films of R—Ge—Ti—O where R is selected from Zr and Hf, and to methods of making the same. The invention is particularly useful in silicon-chip integrated circuit devices such as a capacitor of a dynamic random access memory (DRAM) device.

BACKGROUND OF THE INVENTION

As microelectronic circuits have become increasingly integrated, the demand for smaller components has become stronger. The quest for miniaturization is particularly ardent with regard to DRAM cell devices. The migration of integrated circuits to smaller feature sizes is motivating interest in the development of thin film dielectrics having dielectric constants ($\in$) greater than those of previously used materials. There are many performance constraints on the materials that may be used, however. For instance, DRAM storage capacitors require a capacitance of greater than about 20 fF. See, e.g., El-Kareh et al., "The Evolution of DRAM Cell Technology," Solid STATE TECH. (May 1997), at pp. 89–101.

Typically, films of a-$SiO_x$ have been used as a dielectric material in DRAM capacitors or capacitors of integrated-circuit devices. As the cell size has shrunk, designers have resorted to films of a-$SiO_x$ that are extremely thin or non-planar, but these films are problematic as they exhibit a decreased reliability due to finite breakdown fields or have other attendant problems such as step coverage and conformality. Thus, efforts have been directed toward developing new dielectric materials that can be substituted for a-$SiO_x$ films, thus avoiding the inherent limitations of those films.

Attention has been focused on $Ta_2O_5$, $TiO_2$, and (Ba,Sr)$TiO_3$, the barium strontium titanate composites being referred to as BST. Each of these offers advantages and disadvantages. For example, titanium-oxide ($TiO_2$) has a high dielectric constant ($\in \sim 80$), making films of $TiO_2$ potentially useful in various roles in integrated circuits, such as metal oxide semiconductor or memory capacitors, gate oxides, and other circuit elements. See, e.g., Y. H. Lee et al., "Plasma Enhanced Chemical Vapor Deposition of $TiO_2$ In Microwave-Radio Frequency Hybrid Plasma Reactor," J. VAC. SCI. TECH. A 13 (3) 1995, at p. 596; J. Yan et al., "Structural and Electrical Characterization of $TiO_2$ Grown From Titanium Tetrakis-Isopropoxide (TTIEP) and TTIP/H2O Ambients," J. VAC. SCI. TECH. B 14 (3) 1996, at p. 1706.

However, crystalline $TiO_2$ (x-$TiO_2$) films have demonstrated high leakage currents (low breakdown fields), which adversely influences the operation of DRAM circuits and impacts on the reliability of the capacitors. (Ba,Sr)$TiO_3$ requires high deposition and processing temperatures, making it undesirable for many purposes. Amorphous $Ta_2O_5$ (a-$TiO_2$) is more straightforward to process than Ba,Sr)$TiO_3$, does not require high-temperature processing, and has a low leakage current. However, it has a relatively low dielectric constant ($\in \sim 23$), so it is unlikely to provide a long-term solution. Thus, those involved in the field of dielectric materials continue to search for new materials having high dielectric constants for use in capacitors and microelectronics.

A relative decrease in the dielectric constant for amorphous titanium-oxide-based films is reported in O. Nakagawara et al., "Electrical Properties of (Zr,Sn)$TiO_4$ Dielectric Thin Film Prepared by Pulsed Laser Deposition," J. AAPPL. PHYS. 80, 388 (1996) ("Nakagawara"), which attribute this decrease to the ionic polarizability of the materials. Nevertheless, the applicants have studied amorphous films of titanium-oxide-based materials in the continuing search for new dielectric materials. Amorphous titanium-oxide-based compositions exhibiting useful properties as dielectrics are described in U.S. Pat. No. 5,912,797, titled "Dielectric Materials of Amorphous Compositions and Devices Employing Same," issued Jun. 15, 1999 to the inventors herein, Schneemeyer and VanDover, and assigned to Lucent Technologies, the assignee herein, which is hereby incorporated by reference. The '797 patent describes amorphous titanium-oxide films containing both tin (Sn), and either hafnium (Hf) or zirconium (Zr). The materials of the '797 patent have high dielectric constants of 50–70 and breakdown fields of 4 MV/cm with films of 40–50 nm in thickness. The materials were obtained using off-axis sputtering using three independently controlled guns. Although these new amorphous films have excellent dielectric properties, other constraints must be met to incorporate them within semiconductor products. For example, an etching process, preferably a plasma etching process, must be developed so that the films can be patterned. While titanium may be readily etched because it forms a volatile chloride, the etching behaviors of tin and zirconium are not as well known.

As may be appreciated, those concerned with the development of integrated circuit devices continually search for new materials and methods for improving device performance as the circuit size becomes progressively smaller. This search includes the discovery of new dielectric materials compatible for use in DRAM cells or silicon-chip integrated circuit devices having high dielectric constants and large breakdown fields (low leakage currents), that are relatively uncomplicated to process, and are capable of being readily etched.

SUMMARY OF THE INVENTION

The invention relates to a dielectric film comprising R—Ge—Ti—O, wherein R is selected from zirconium and hafnium. The dielectric film is preferably an amorphous composition having the formula $R_x$—$Ge_y$—$Ti_z$—$O_w$, where $0.05 \geq x \leq 1$, $0.05 \geq y \leq 1$, $0.1 \geq z \leq 1$, and $1 \geq w \leq 2$, and x+y+z$\cong$1 and more preferably, where $0.15 \geq x \leq 0.7$, $0.05 \geq y \leq 0.3$, $0.25 \geq z \leq 0.7$, and $1.95 \geq w \leq 2.05$. The thickness of the film and values for x, y, z and w may be selected so that a thin film (~80–100 nm) of the material will exhibit a dielectric constant of about 40 or higher, leakage current of less than $10^{-6}$ A/cm$^2$, and a figure of merit of about 18 $\mu$C/cm$^2$ or higher.

BRIEF DESCRIPTION OF THE DRAWINGS

For a better understanding of the invention, an exemplary embodiment is described below, considered together with the accompanying drawings, in which.

It is to be understood that these figures are for the purposes of illustrating the concepts of the invention and except for the graphs are not to scale.

DETAILED DESCRIPTION OF THE INVENTION

Applicants have discovered new dielectric materials comprising R—Ge—Ti—O, wherein R is selected from zirconium (Zr) and hafnium (Hf). With these materials, amorphous films having a thickness of about 80–100 nm may be prepared having relatively high dielectric constants ($\in$~40–80), which is approximately twice the dielectric constant of tantalum oxide, $Ta_2O_5$, or greater. Breakdown fields of these films are about 2–3 MV/cm, yielding a Figure of Merit of about 18 $\mu C/cm^2$ or higher. Leakage currents, measured at a stored charge value of 7 $\mu C/cm^2$, were in the range of about $10^{-6}$ A/$cm^2$. Films can be codeposited in an off-axis geometry at substrate temperatures of about 200 degrees C., using three independently controlled RF sputtering guns. Substrate bias also can be applied using additional RF power supply.

The discussion below is divided into three parts. In Part A, an application of this invention is described with reference to use of the dielectric material in a DRAM capacitor. In Part B, the inventive dielectric materials and preferred embodiments are described. Lastly, in Part C, methods for making the dielectric film are described.

A. Application Example

Figure 1:
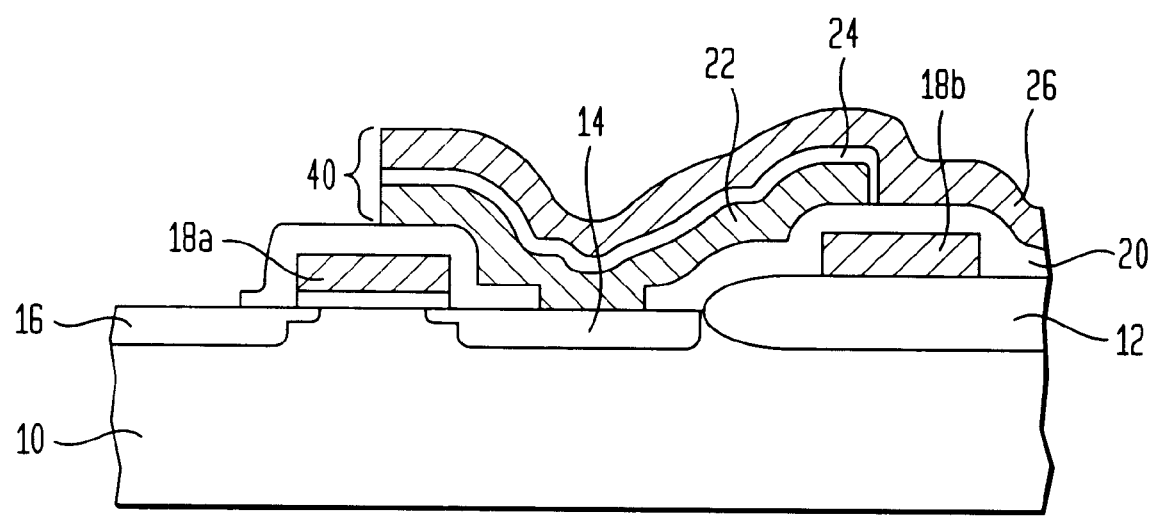
FIG. 1 is a schematic cross-sectional view of one embodiment of a DRAM cell design comprising a dielectric layer according to the invention.

By way of illustration, FIG. 1 shows a cross-section of a typical stacked capacitor DRAM design incorporating the dielectric layer of this invention; however, it is to be understood that the invention is not limited to use with DRAM cells and may be used in other applications as well, such as hybrid integrated circuits, capacitors of other devices, or MOSFET gate dielectrics.

A common cell design used in DRAM applications involves a transfer gate (e.g., an MOS field-effect transistor or MOSFET), and a storage node consisting of a capacitor 40. Referring to FIG. 1, a basic structure for the MOSFET is shown. The substrate 10, comprised typically of silicon, is doped with ions to form impurities regions of n-type or p-type conductivity, as is known, to form source 14 and drain 16 diffusions and gate structures 18a, 18b for the MOSFET. The substrate 10 will have disposed on its surface a field oxide pattern (or FOX) 12.

The capacitor 40 is disposed on the silicon substrate 10 in conductive relation with one or more of the impurity regions, comprising a bottom electrode 22 and top electrode 26, separated by a thin film of a dielectric material 24. The electrodes 22, 26 may be comprised of thin films of Ti, TiN, Al, Al doped with 0.5% Cu, or other materials known in the art for forming electrodes for DRAM applications. The film of dielectric material 24 fills the space between the bottom electrode 22 and top electrode 26, and is comprised of the inventive dielectric materials, to form a capacitor. An insulating layer 20, typically comprised of boron phosphorus silicate glass, may separate the capacitor from the gate structures 18a, 18b.

In another exemplary application, the inventive dielectric is used for the gate dielectric of a MOSFET device, e.g., a device having a metal-insulator-semiconductor gate structure. Such devices are known in the field and described in the literature.

B. Preferred Compositions

Applicants have discovered dielectric materials comprising R—Ge—Ti—O, where R=Zr or Hf. The materials may be described as amorphous compositions having the formula $R_x$—$Ge_y$—$Ti_z$—$O_w$. The thickness of the film and the values for x, y, z and w may be selected so that the dielectric constant of the composition is greater than about 40, the leakage current is less than $10^{-6}$ A/$cm^2$ and the figure of merit is greater than about 18 $\mu C/cm^2$. In particular, preferred compositions are those in which $0.05 \geq x \leq 1$, $0.05 \geq y \leq 1$, $0.1 \geq z \leq 1$, and $1 \geq w \leq 2$, and where x+y+z≅1. More preferred compositions are those in which $0.15 \geq x \leq 0.7$, $0.05 \geq y \leq 0.3$, $0.25 \geq z \leq 0.7$, and $1.95 \geq w \leq 2.05$, and again, where x+y+z ≅1.

However, preferred compositions with Hf have lower titanium concentrations than those using Zr. More particularly, advantageously the Hf compositions comprise about 30 to 55 at. % titanium, whereas the preferred Zr compositions comprise about 50 to 70 at. % titanium. Thus, when R is Zr, a range of more particularly preferred compositions is $0.15 \geq x \leq 0.5$, $0.05 \geq y \leq 0.25$, $0.5 \geq z \leq 0.7$, and $1.95 \geq w \leq 2.05$. However, when R is Hf, a slightly different range of constituents is particularly preferred, i.e., $0.30 \geq x \leq 0.7$, $0.05 \geq y \leq 0.3$, $0.25 \geq z \leq 0.6$, and $1.95 \geq w \leq 2.05$.

Figure 2:
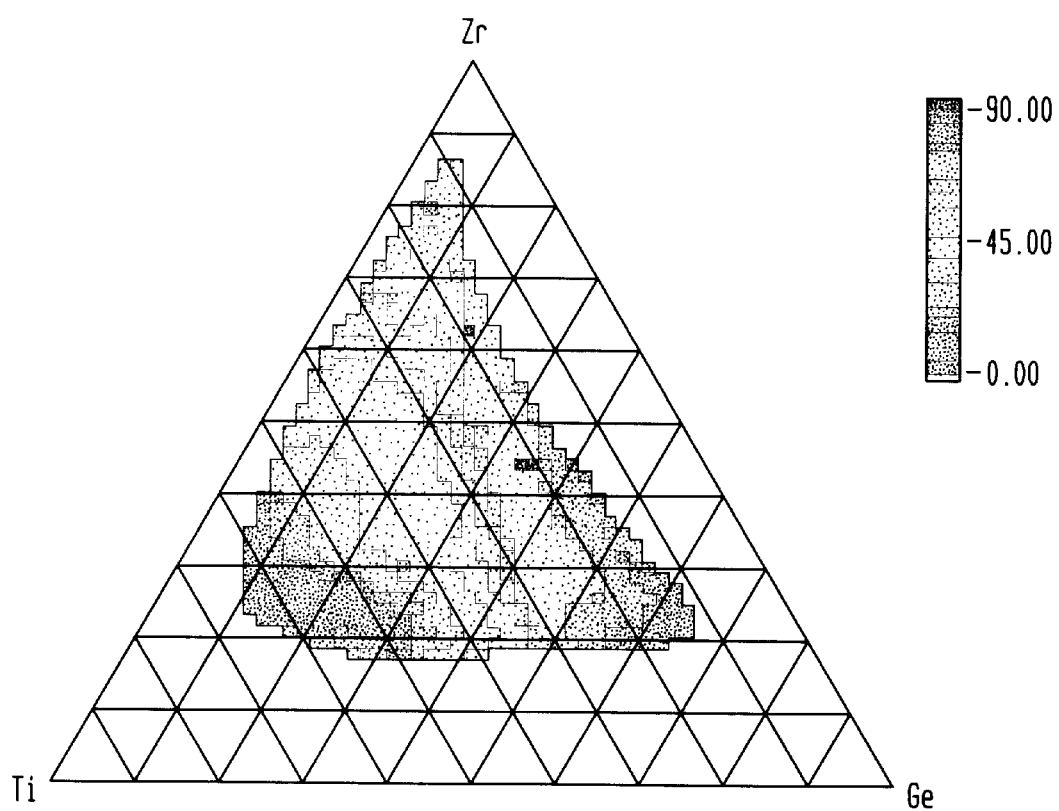
FIG. 2 is a phase diagram reflecting the dielectric constant of the inventive materials (where R=Z) as a function of Zr, Ge, and Ti content.
Figure 3:
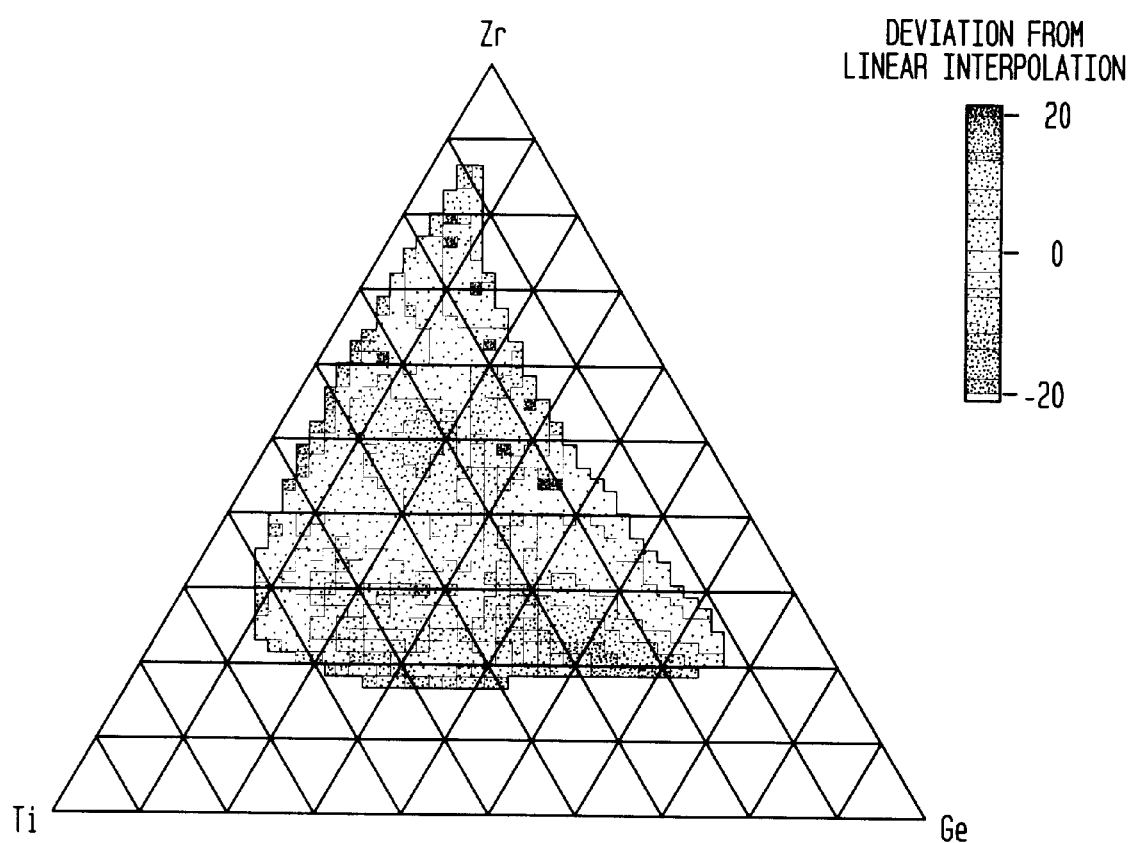
FIG. 3 is a phase diagram showing deviations from a linear interpolation of the dielectric constant using values for the end members of $\in(TiO_w)=100$, $\in(ZrO_w)=20$, and $\in(GeO)=5.8$.

FIG. 2 is a phase diagram reflecting the dielectric constant of the materials as a function of Zr, Ge and Ti content (i.e., where R is Zr). As can be seen, a dominant trend is that the dielectric constant increases with increasing Ti content. However, this trend may be subtracted from the data, considering a linear interpolation between the end members. For example, FIG. 3 is a phase diagram showing deviations from a linear interpolation of the dielectric constant using values for the end members of $\in(TiO_w)=100$, $\in(ZrO_w)=20$, and $\in(GeO)=5.8$. As may be noted, there is a significant deviation from the linear interpolation to lower values for $\in$ for the Ge-rich compositions, and a less definite increase in the vicinity of $Zr_{0.25}Ge_{0.25}Ti_{0.5}O_2$.

Figure 4:
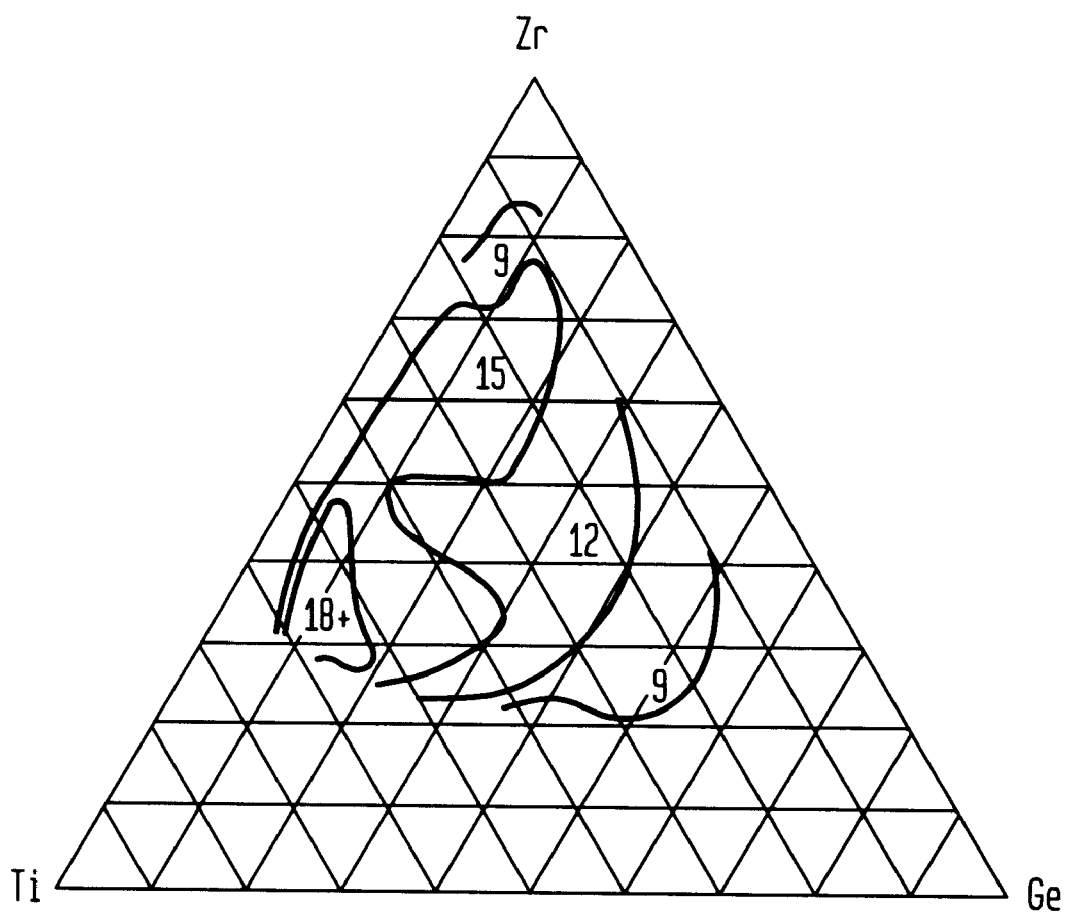
FIG. 4 is a phase diagram reflecting the Figure of Merit of the materials (where R is Zr) as a function of Zr, Ge, and Ti content.
Figure 5:
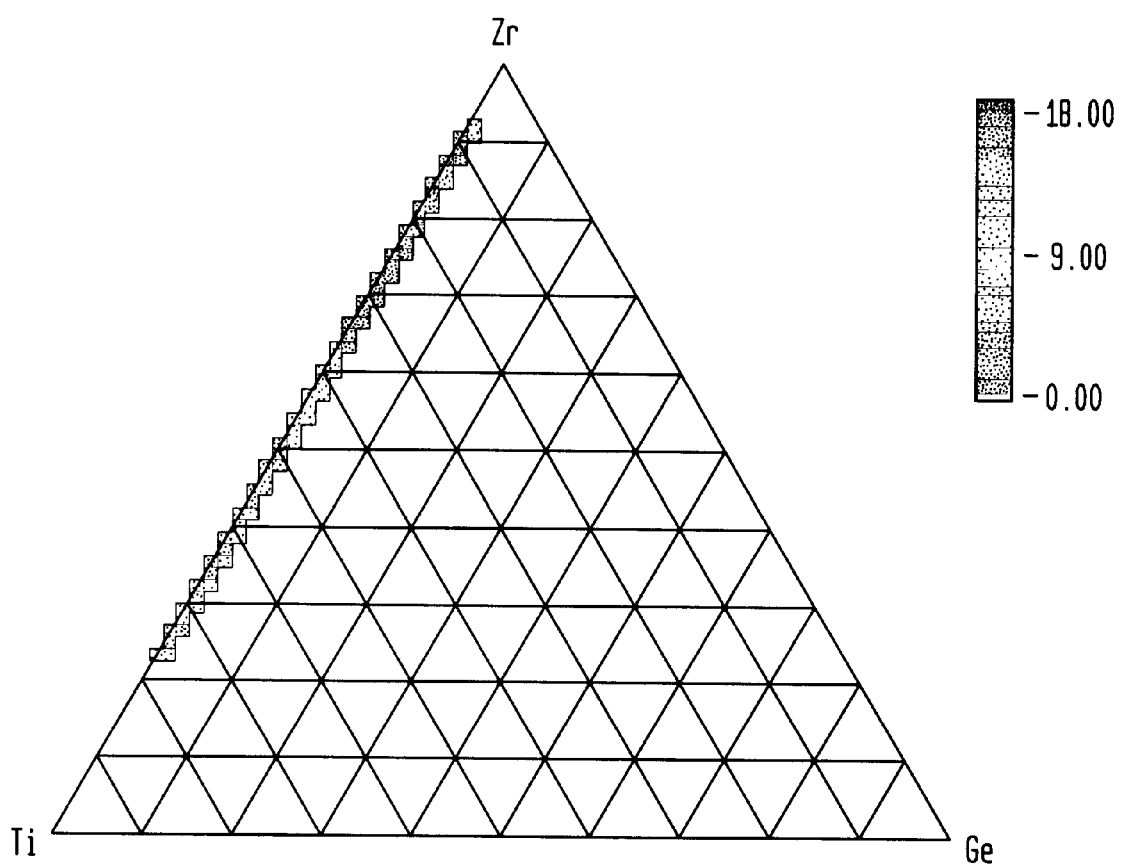
FIG. 5 is a phase diagram reflecting the Figure of Merit of $TiO_w$—$ZrO_w$ films containing no germanium.

FIG. 4 is a phase diagram reflecting the Figure of Merit of the dielectric materials (again, where R is Zr) as a function of Zr, Ti, and Ge content. The region with the highest Figure of Merit (FOM), lies in the titanium-rich region 18 of the diagram. However, applicants discovered that advantageously germanium is included in the films to produce the high-dielectric films. For example, FIG. 5 is a phase diagram reflecting the FOM of $TiO_w$—$ZrO_w$ films containing no germanium. While use of up to 5–15 atomic percent Ge has little impact on the dielectric constants, the breakdown fields of the germanium-free films are lower, leading to a consistently lower FOM.

Figure 6:
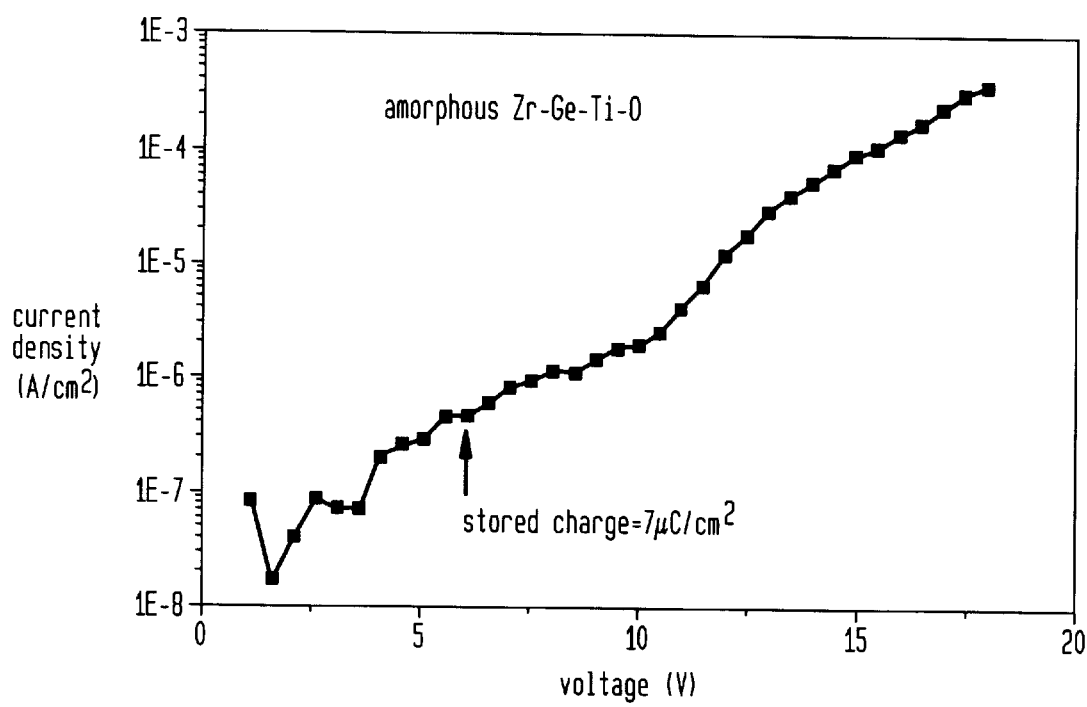
FIG. 6 is a graph plotting the current density of 80-nm thick dielectric materials having the approximate composition $Zr_{0.3}Ge_{0.1}Ti_{0.6}O_w$, as a function of voltage measured on a TiN capacitor.

FIG. 6 is a graph plotting the current density of the dielectric materials having the approximate composition $Zr_{0.3}Ge_{0.1}Ti_{0.6}O_w$ as a function of voltage. The films had a thickness of about 80 nm, and voltage measurements were taken on a capacitor with TiN as the bottom electrode and Hg as the top electrode. A stored charge of 7 $\mu C/cm^2$ was obtained at 6.6V, which is representative of the operating point for a high-density stacked capacitor. The leakage current measured at the corresponding voltage was less than $10^{-6}$ A/cm$^2$, and the breakdown voltage was 17V, leading to a FOM of $CV_{br}/A=18.7$ $\mu C/cm^2$.

Figure 7:
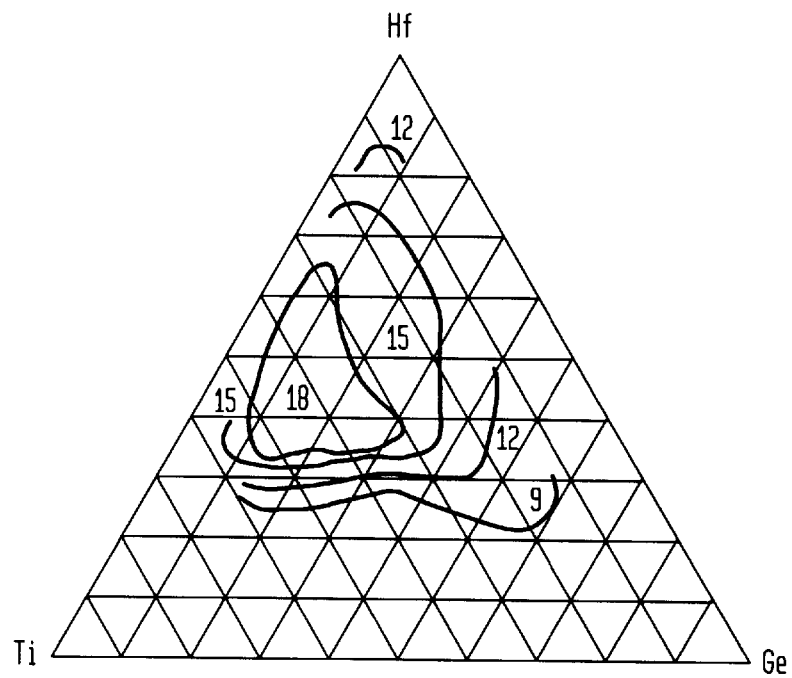
FIG. 7 is a phase diagram reflecting the Figure of Merit of the materials (where R is Hf) as a function of Hf Ge, and Ti content.

FIG. 7 is a phase diagram reflecting the Figure of Merit of the materials where R is Hf, as a function of Hf, Ge, and Ti content. As can be seen, the materials comprising Hf—Ge—Ti—O have advantageous dielectric properties as do those with Zr—Ge—Ti—O. Thus, the inventive compositions have advantageous dielectric properties, e.g., high dielectric constant (about ~70), low leakage current (less than ~$10^{-6}$ A/cm$^2$), and high FOM (greater than ~18 $\mu C/cm^2$). Also, germanium forms a volatile chloride which provides advantages for etching processes. The films may be doped with small amounts (less than 5 at. percent) of cations or anions (e.g., N or F), to compensate for oxygen traps in the deposited oxide. Other dopants may include Mg, Ca, Sr, Y, Al or In.

Notably, the compositions described herein differ from the compositions of the '797 patent, referenced above. The '797 patent describes use of Sn, which has large size differences and chemical dissimilarities as compared with Ge. For example, $Ge^{4+}$ has an ionic radius of 0.053 nm, while $Sn^{4+}$ has a radius of 0.069 nm. $Ge^{4+}$ has a chemistry more comparable with Si than Sn because it is small enough to occupy tetrahedral holes, whereas $Sn^{4+}$ prefers larger coordination spheres, such as octahedral environments. Thus, one skilled in the field would expect different packing arrangements for amorphous zirconium-titanium-tin (aZTT) oxides as compared with amorphous zirconium-titanium-germanium (aZTG) oxides or amorphous hafnium-titanium-germanium (aHTG) oxides. Furthermore, no ternary crystalline phases of Zr—Ge—Ti—O or Hf—Ge—Ti—O have been disclosed in the literature. Therefore, one skilled in the art would not expect comparable properties in the ZTG or HTG systems. Yet surprisingly, the aZTG and aHTG oxides display high dielectric constants together with low breakdown field and low leakage currents, albeit at different compositions that the aZTT oxides previously studied.

C. Sample Preparation

Figure 8:
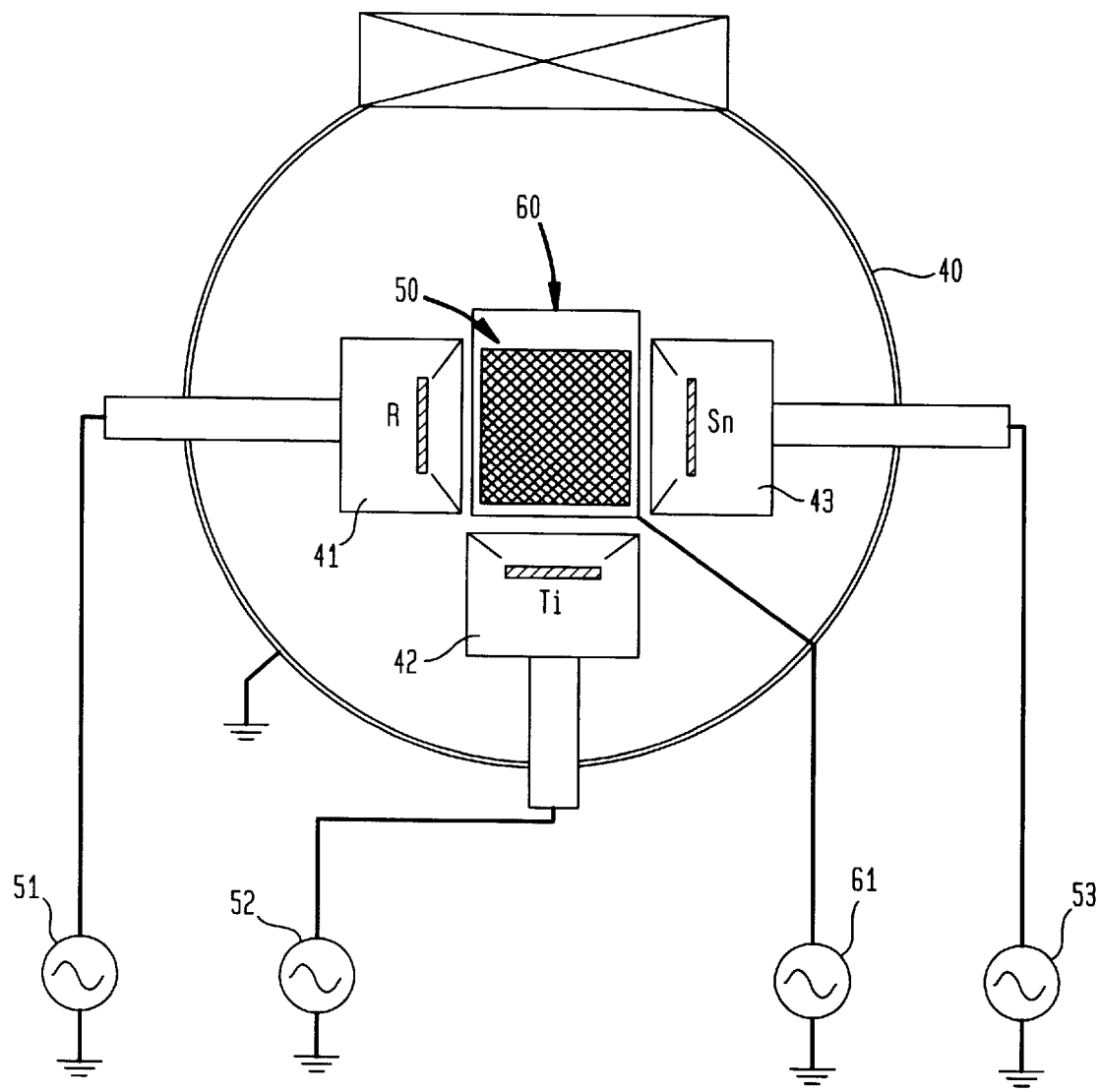
FIG. 8 is a schematic representation of a deposition system that may be used in forming the dielectric film according to the invention.

Various techniques known in the field are suitable for preparation of the inventive films. However, an advantageous method for making the films comprises off-axis sputtering. A schematic representation of a sputtering apparatus useful for depositing the films is shown in FIG. 8. The apparatus comprises a vacuum chamber 40, having a gate valve 45, and three planar magnetron sputter guns 41, 42, 43 disposed therein. The guns employ metallic sputter targets of R (i.e., Zr or Hf), Ge and Ti, respectively. Advantageously they may comprise two-inch diameter targets arranged facing each other at 90° intervals. A substrate 50 is placed on a sample holder 60 and disposed in parallel to the plane defined by the centers of the three sputter guns and displaced below that plane, e.g., by about one-inch below that plane. The guns are each connected to RF sources 51, 52, 53, respectively, and allowed to self-bias. To obtain the preferred compositions described herein, the guns may be run at about 75, 150, and 20W, respectively, and advantageously, a 600W RF power supply and impedance matchbox is used. Depositions may be performed with a total pressure of 30 mTorr, using about 40% by volume $O_2$, balance Ar, in the chamber.

The substrate 50 used for deposition of the dielectric films typically comprises a silicon wafer coated with about 5500 Å thermal oxide, 450 Å Ti, and 600 Å TiN. Prior to the deposition process, the substrate 50 may be mounted to a thick aluminum substrate holder using stainless steel screws and washers. The substrate holder 60 may be connected to a power source 61, for providing RF power (preferably about 10W), during the deposition process to promote surface mobility on the growing film. The substrate holder also may be heated with a radiant heater and monitored with a chrome/alumel thermocouple inserted into the substrate holder. Preferably, the temperature should remain constant during the deposition, with the temperature of the substrate holder held at about 200° C.

An exemplary process for obtaining dielectric materials having advantageous properties as described above is as follows. The deposition apparatus is arranged as above, with three sputter guns for Zr (or Hf), Ge and Ti. The chamber 40 is pumped to less than $5\times10^{-6}$ Torr, and the temperature of the substrate is raised to 200° C. Oxygen gas ($O_2$) is introduced in the chamber 40 along with argon gas (Ar) at 10 sccm and 15 sccm, respectively (sccm referring to cubic centimeters per minute at standard pressure and temperature). The pressure in the chamber is raised to 30 mTorr by partially closing the main gate valve 45. The RF sources are then activated to provide RF power to the sputter guns 41, 42, and 43 at levels of 75, 150 and 20W, respectively, and RF source 61 provides power to the substrate holder at 10W. The RF matching circuits are tuned to each RF supply to obtain minimum reflected power. The RF sources are capacitatively coupled to the guns and substrate holder, and allowed to self bias. The sputter deposition is allowed to run for twenty minutes, and then the RF power and gas supplied are turned off. The substrate holder is cooled to about 60° C. in vacuo. The system is then vented and the sample is retrieved.

The above exemplary process is only one among many ways in which the materials may be formed. One skilled in the field would recognize that the deposition conditions may be optimized to achieve materials having desired dielectric properties, e.g., the oxygen partial pressure, substrate temperature, target configuration, substrate bias, and so forth, may be adjusted to lead to both an increase in the breakdown field and decrease in the leakage current. Also, instead of the reactive sputtering method described above, other methods may be used, such as ion beam sputtering, chemical vapor deposition, electron cyclotron resonance sputtering, molecular beam epitaxy, or laser ablation. The invention is not limited to the examples or method of preparation described above.

It should be understood that the embodiments described herein are merely exemplary and that a person skilled in the art may make variations and modifications without departing from the spirit and scope of the invention. All such variations and modifications are intended to be included within the scope of the appended claims.

We claim:

1. An article including a film of dielectric material having the formula $R_x$—$Ge_y$—$Ti_z$—$O_w$, wherein R is selected from the group consisting of zirconium and hafnium and $0.05 \geq x \leq 1$, $0.05 \geq y \leq 1$, $0.1 \geq z \leq 1$, $1 \geq w \leq 2$ and $x+y+z \approx 1$, in which the values for x, y, z and w are selected so that the dielectric constant of the dielectric material is greater than about 40, the leakage current is less than $10^{-6}$ A/cm$^2$ measured at a field of 1 MV/cm, and the figure of merit is greater than about 18 $\mu C/cm^2$.

2. The article of claim 1, wherein the dielectric material comprises an amorphous composition.

3. The article of claim 1 in which the dielectric material has the formula $R_{0.3}$—$Ge_{0.1}$—$Ti_{0.6}$—$O_w$ and $1 \geq w \leq 2$.

4. The article of claim 1 in which $0.15 \geq x \leq 0.7$, $0.05 \geq y \leq 0.3$, $0.25 \geq z \leq 0.7$, and $1.95 \geq w \leq 2.05$, and $x+y+z \cong 1$.

5. The article of claim 1 in which R is zirconium and $0.15 \geq x \leq 0.5$, $0.05 \geq y \leq 0.25$, $0.5 \geq z \leq 0.6$, and $1.95 \geq w \leq 2.05$.

6. The article of claim 1 in which R is hafnium and $0.15 \geq x \leq 0.7$, $0.05 \geq y \leq 0.3$, $0.25 \geq z \leq 0.7$, and $1.95 \geq w \leq 2.05$.

7. The article of claim 1 in which the film of dielectric material is prepared by off-axis sputtering.

8. The article of claim 1, comprising a capacitor having a pair of electrodes with the film of dielectric material disposed between the electrodes.

9. The article of claim 1, comprising a MOSFET device with the film of dielectric material comprising a gate dielectric for the MOSFET.

10. The article of claim 1, comprising a memory device having a field effect transistor and a capacitor.

11. The article of claim 10, comprising a DRAM device.

12. A memory device having a field effect transistor and a capacitor, in which the field effect transistor has a gate dielectric and the capacitor comprises a pair of electrodes and disposed between the electrodes a layer of dielectric material, in which at least one of the gate dielectric or the layer of dielectric material comprises the film of dielectric material according to claim 1.

13. A capacitor comprising a pair of electrodes and disposed between the electrodes a layer of dielectric material, in which the layer of dielectric material comprises the film according to claim 1.

14. An article including a film of dielectric material having the formula $R_x$—$Ge_y$—$Ti_z$—$O_w$ wherein R is selected from the group consisting of zirconium and hafnium and $0.05 \geq x \leq 1$, $0.05 \geq y \leq 1$, $0.1 \geq z \leq 1$, $1 \geq w \leq 2$ and $x+y+z \cong 1$, in which the dielectric material is doped with less than 5 atomic percent of cations or anions to compensate for oxygen traps in the deposited oxide.

15. The article of claim 14 in which the dopants are selected from the group consisting of N, F, Mg, Ca, Sr, Y and Al.

* * * * *